United States Patent
Tsuruta

(10) Patent No.: US 7,471,124 B2
(45) Date of Patent: Dec. 30, 2008

(54) CHOPPER CIRCUIT THAT CHOPS EDGE OF CONTROL SIGNAL

(75) Inventor: Tomoya Tsuruta, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 86 days.

(21) Appl. No.: 11/445,143

(22) Filed: Jun. 2, 2006

(65) Prior Publication Data

US 2007/0229125 A1 Oct. 4, 2007

(30) Foreign Application Priority Data

Mar. 28, 2006 (JP) .............................. 2006-089039

(51) Int. Cl.
*H03K 17/00* (2006.01)
(52) U.S. Cl. ......................... 327/124; 327/34; 327/173; 326/121
(58) Field of Classification Search ................. 326/121; 327/34, 124, 173
See application file for complete search history.

(56) References Cited

U.S. PATENT DOCUMENTS

| | | | | |
|---|---|---|---|---|
| 4,216,388 A | * | 8/1980 | Wilson | 327/34 |
| 4,233,525 A | * | 11/1980 | Takahashi et al. | 327/34 |
| 4,760,279 A | * | 7/1988 | Saito et al. | 327/34 |
| 4,825,106 A | * | 4/1989 | Tipon et al. | 326/121 |
| 5,374,860 A | * | 12/1994 | Llewellyn | 327/276 |
| 5,386,392 A | * | 1/1995 | Cantiant et al. | 365/233.1 |
| 6,124,737 A | * | 9/2000 | Lan et al. | 326/121 |
| 6,369,615 B1 | * | 4/2002 | Shimizu et al. | 326/93 |
| 6,977,528 B2 | * | 12/2005 | Kang et al. | 326/121 |
| 2002/0021159 A1 | * | 2/2002 | Takahashi | 327/283 |
| 2002/0130704 A1 | * | 9/2002 | Myono et al. | 327/536 |

FOREIGN PATENT DOCUMENTS

| | | |
|---|---|---|
| JP | 55-80136 A | 6/1980 |
| JP | 7-93999 A | 4/1995 |

* cited by examiner

*Primary Examiner*—Lincoln Donovan
*Assistant Examiner*—William Hernandez
(74) *Attorney, Agent, or Firm*—Arent Fox LLP.

(57) ABSTRACT

A chopper circuit has a delay circuit that delays a received control signal and a difference detection circuit that detects a difference between a control signal delayed by the delay circuit and the received control signal. A first threshold based on which the delay circuit checks a change in the received control signal and a second threshold based on which the difference detection circuit checks a change in the received control signal are realized with a common threshold.

10 Claims, 7 Drawing Sheets

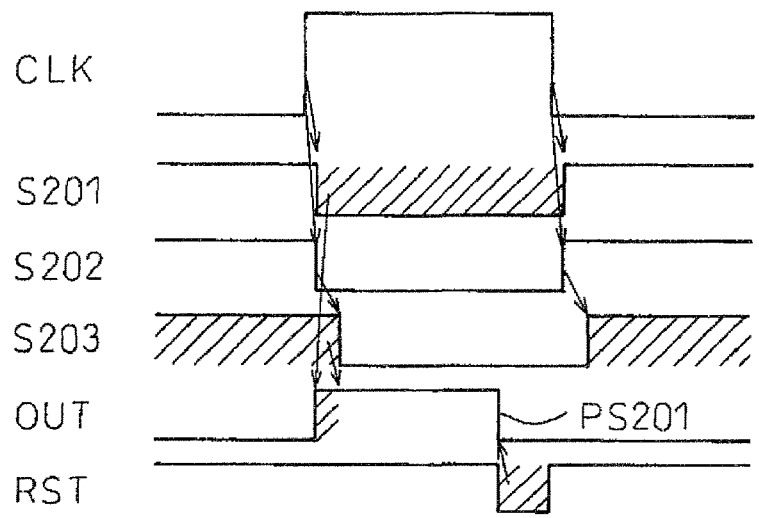
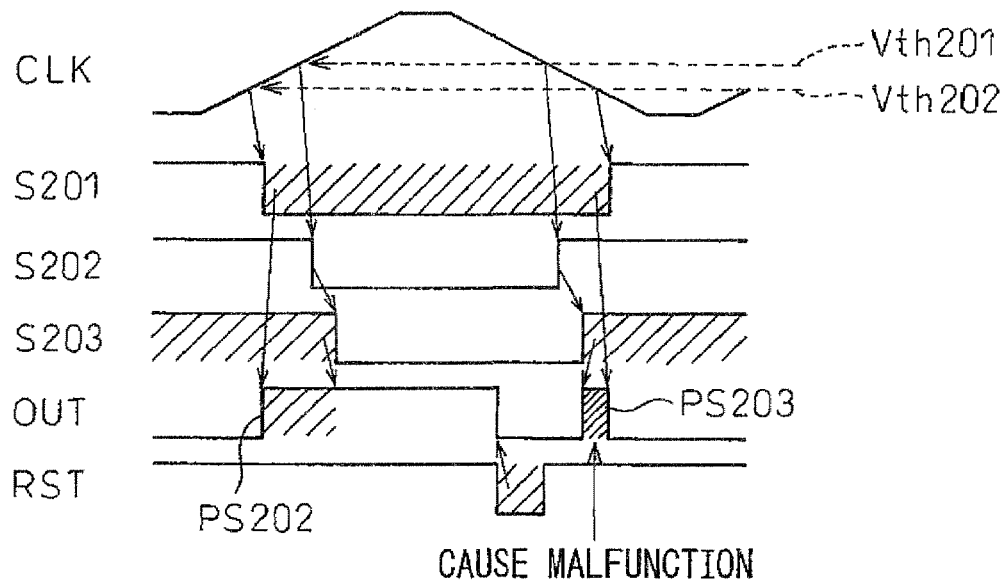

CHOPPER CIRCUIT THAT CHOPS EDGE OF CONTROL SIGNAL

CROSS REFERENCE TO RELATED APPLICATION

This application is based upon and claims the benefit of priority from, the prior Japanese Patent Application No. 2006-089039, filed on Mar. 28, 2006, the entire contents of which are incorporated herein by reference.

BACKGROUND OF THE INVENTION

1. Field of the Invention

The present invention relates to a chopper circuit and, more particularly, to a chopper circuit that chops the edge of a wave of a received control signal such as a clock, so as to reshape the wave.

2. Description of the Related Art

In the prior art, for example, when a clock signal is used with the waveform thereof left intact, as a designing is required to take account of both the timings of the leading and trailing edges of the clock signal, a chopper circuit (clock chopper circuit) that produces a pulsating signal by detecting the leading edge of the clock signal is necessary.

The employment of the clock chopper circuit obviates the necessity, in design, of taking account of various changes in the timing of the leading edge of a received clock signal. This specification describes a clock chopper circuit as an example of a chopper circuit. Note that the present invention is not limited to a chopper circuit for a clock signal.

Incidentally, Japanese Unexamined Patent Publication (Kokai) No. 55-080136 has proposed, as a clock distribution method for readily and precisely achieving phasing, a method of setting the duty cycle of a clock, which is produced by a clock signal source, to approximately 50%, disposing a wave converter circuit near each load circuit, and applying a distributed clock signal to each of the load circuits via each of the wave converter circuits.

Moreover, Japanese Unexamined Patent Publication (Kokai) No. 07-093999 has proposed as a type of array clock generator circuit, which drives all fast SRAM macros in a system memory whose cycle time is short, a circuit that is realized with a semiconductor chip on which a built-in clock generator that generates two clock waves, one of which lags behind the other (that has chopper circuits set in array so as to produce a plurality of clock signals), is mounted. Herein, the circuit is inspected by performing an array built-in self-test (ABIST) without applying two high-precision clock signals using an expensive tester.

The prior art and its associated problems will be described later with reference to the accompanying drawings.

SUMMARY OF THE INVENTION

An object of the present invention is to provide a chopper circuit that does not malfunction despite the deformation of a wave of a received control signal.

According to the present invention, there is provided a chopper circuit comprising a delay circuit that delays a received control signal and a difference detection circuit that detects a difference between a control signal delayed by the delay circuit and the received control signal, wherein a first threshold, based on which the delay circuit checks a change in the received control signal, and a second threshold, based on which the difference detection circuit checks a change in the received control signal, are realized with a common threshold.

The delay circuit may comprise an odd number of stages of NOR gates connected in series with one another. The first threshold, based on which the delay circuit checks a change in the received control signal, and the second threshold, based on which the difference detection circuit checks a change in the received control signal may be realized with a threshold to be used by a common logic circuit that receives the control signal.

The difference detection circuit may comprise a first transistor of a first conductivity type having a source connected to a first power line and a gate supplied with the control signal; a second transistor of the first conductivity type having a source connected to the first power line and a gate supplied with an output signal of the delay circuit; a third transistor of a second conductivity type having a drain connected to drains of the first and second transistors respectively and a gate supplied with the output signal of the delay circuit; a fourth transistor of the second conductivity type having a source connected to a second power line and a gate supplied with the control signal; and a fifth transistor of the first conductivity type connected in common to each of the first power line, a source of the third transistor, and a drain of the fourth transistor, wherein the fourth and fifth transistors constitute an inversion logic gate on a first stage in the delay circuit.

The inversion logic gate on the first stage may be realized with an inverter. The inversion logic gate on the first stage may be realized with a NAND gate having a first input terminal supplied with the control signal and a second input terminal supplied with an enabling signal.

The delay circuit may comprise an odd number of stages of inverters. The delay circuit may comprise a NAND gate having a first input terminal supplied with an output signal of the inversion logic gate and a second input terminal supplied with an enabling signal.

The difference detection circuit may comprise a first transistor of a first conductivity type having a source connected to a first power line and a gate supplied with a reset signal; a second transistor of a second conductivity type having a drain connected to a drain of the first transistor and a gate supplied with an output signal of the delay circuit; and a NOR gate having a first input terminal supplied with an output of an inverter which is connected to a common drain of the first and second transistors, and a second input terminal supplied with the control signal, wherein the NOR gate may realize the inversion logic gate on the first stage in the delay circuit.

The difference detection circuit may comprise a first transistor of a first conductivity type having a source connected to a first power line and a gate supplied with a reset signal; a second transistor of a second conductivity type having a drain connected to a drain of the first transistor and a gate supplied with an output signal of the delay circuit; and an inverter that receives the control signal, the inverter realizing the inversion logic gate on a first stage in the delay circuit, and wherein the difference detection circuit may comprise a NOR gate having a first input terminal supplied with an output of the inverter which is connected to a common drain of the first and second transistors, and a second input terminal supplied with an output signal of the first stage of the inversion logic gate via another inversion logic gate.

The another inversion logic gate may comprise a NAND gate having a first input terminal supplied with the output signal of the inversion logic gate, and a second input terminal supplied with an enabling signal. The control signal may be a clock signal, and the chopper circuit may be a clock chopper circuit.

BRIEF DESCRIPTION OF THE DRAWINGS

The present invention will be more clearly understood from the description of the preferred embodiments as set forth below with reference to the accompanying drawings, wherein:

FIG. 5 shows the waveforms of signals to explain the actions to be performed in the clock chopper circuit shown in FIG. 4 (part 1);

FIG. 6 shows the waveforms of signals to explain the actions to be performed in the clock chopper circuit shown in FIG. 4 (part 2);

DESCRIPTION OF THE PREFERRED EMBODIMENTS

Before describing in detail the preferred embodiments of the present invention, a conventional clock chopper circuit and its underlying problems will be mentioned with reference to FIGS. 1 to 6.

Figure 1:
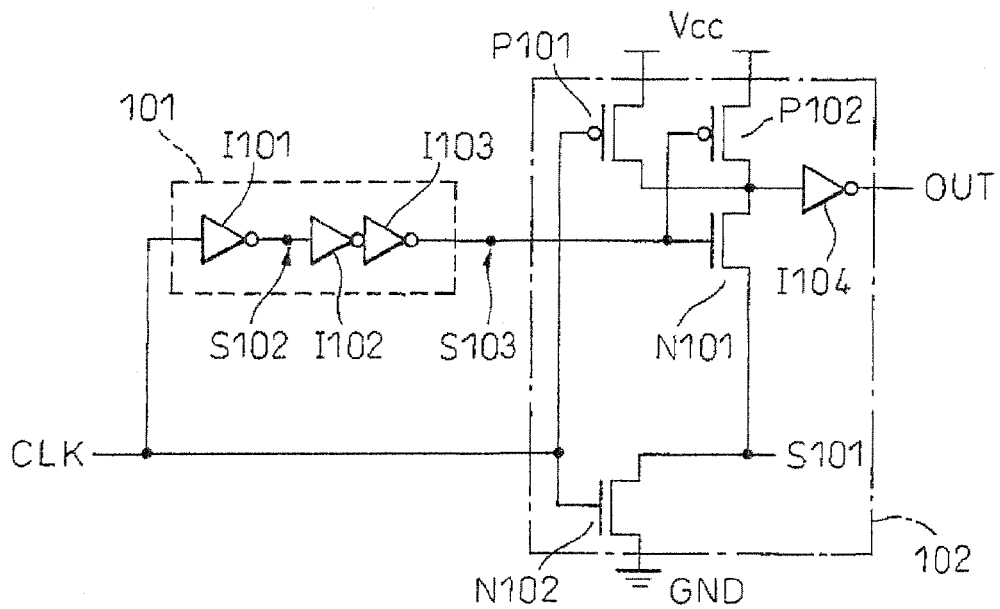
FIG. 1 is a circuit diagram showing an example of a conventional clock chopper circuit.
Figure 2:
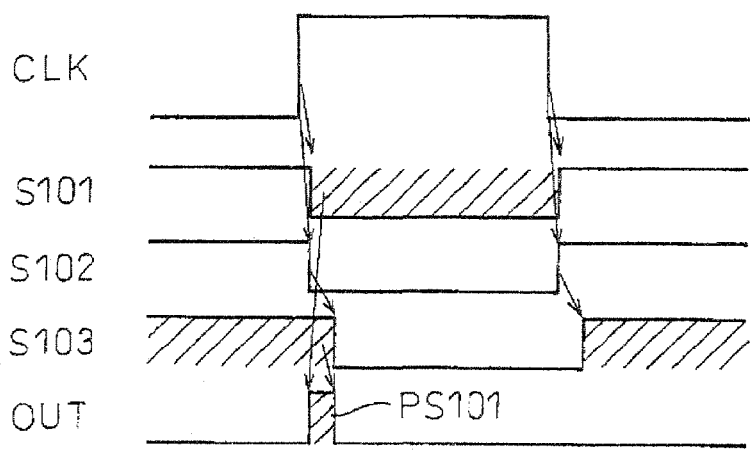
FIG. 2 shows the waveforms of signals to explain the actions to be performed in the clock chopper circuit shown in FIG. 1 (part 1)
Figure 3:
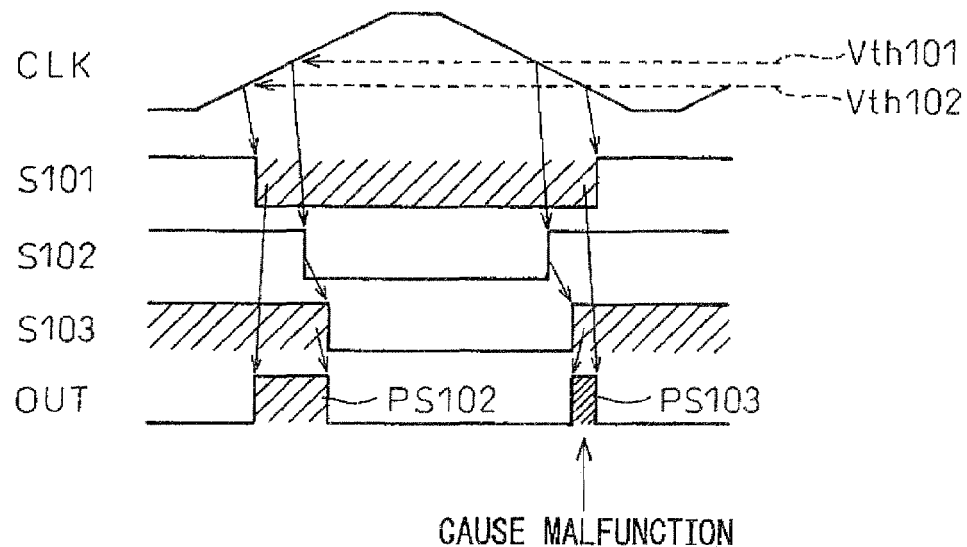
FIG. 3 shows the waveforms of signals to explain the actions to be performed in the clock chopper circuit shown in FIG. 1 (part 2)

FIG. 1 is a circuit diagram showing an embodiment of a conventional clock chopper circuit. FIGS. 2 and 3 show the waveforms of signals to explain the actions to be performed in the clock chopper circuit shown in FIG. 1. Herein, FIG. 2 is intended to explain a case where a clock chopper circuit shown in FIG. 1 operates normally. FIG. 3 is intended to explain a case where the clock chopper circuit shown in FIG. 1 malfunctions.

As shown in FIG. 1, an example of a conventional clock chopper includes inverters I101 to I104, p-channel metal-oxide semiconductor (PMOS) transistors P101 and P102, and n-channel MOS (NMOS) transistors N101 and N102.

The inverters I101 to I103 (odd number of stages of NOR gates) constitute a delay circuit 101 that delays (and reversing) a wave of a clock signal CLK (control signal). The PMOS transistors P101 and P102, the NMOS transistors N101 and N102, and the inverter I104 constitute a difference detection circuit 102 that detects a difference between an output signal S103 of the delay circuit 101 (delayed clock signal) and the clock signal CLK (AND circuit composed of a NAND circuit including the transistors P101, P102, N101, and N102 and the inverter I104).

As shown in FIG. 2, when the clock chopper circuit shown in FIG. 1 receives a clock signal CLK having a normal wave (that is not deformed), it operates normally. The clock chopper circuit transmits as an output OUT a pulsating wave PS101 that is produced at the timing when a component (hatched area) of the signal S101 and a component (hatched area) of the signal S103 overlap.

As shown in FIG. 3, when the clock chopper circuit receives a clock signal CLK of a deformed wave (that exhibits a large slew rate), not only a correct pulsating wave PS102 but also an incorrect pulsating wave PS103 are transmitted as an output OUT. This is attributable to the fact that a component of the signal S101 (hatched area in FIG. 3) and a component of the signal S103 (hatched area in FIG. 3) overlap at two timings because of a difference between a threshold Vth101 set for the inverter I101 on the first stage in the delay circuit 101 and a threshold Vth102 set for the transistor N102 included in the difference detection circuit 102.

This is because, for example, at what intermediate potential level (timing) of the input clock signal CLK a CMOS inverter (inverter I101), composed of PMOS and NMOS transistors and the NMOS N102, initiates reaction (switching) depends not only on a designing factor of a difference in characteristics between the p-channel and n-channel transistors but also a difference of one transistor from the others occurring in the course of manufacture.

Figure 4:
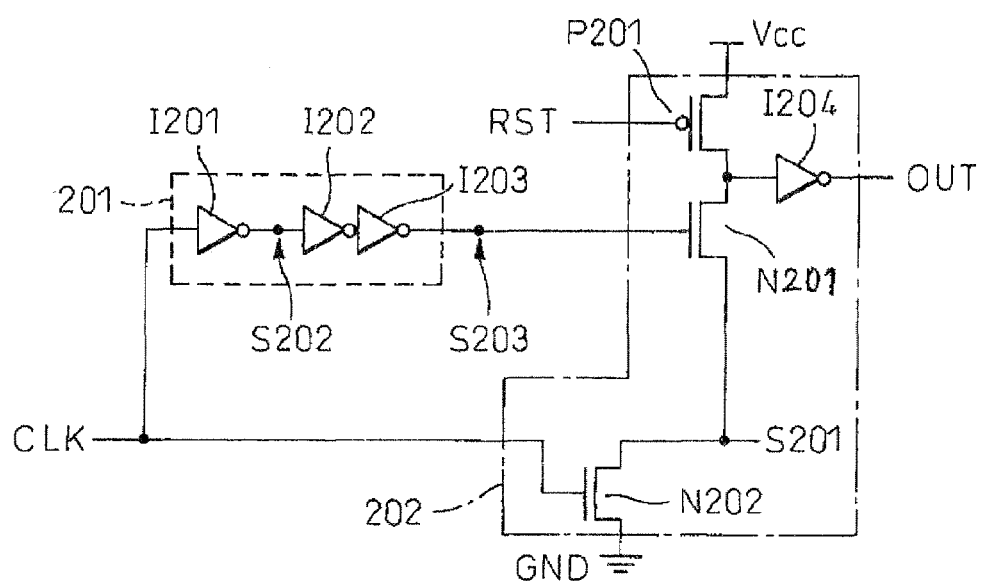
FIG. 4 is a circuit diagram showing another example of a conventional clock chopper circuit.

FIG. 4 is a circuit diagram showing another example of a conventional clock chopper circuit. FIGS. 5 and 6 show the waveforms of signals to explain the actions to be performed in the clock chopper circuit shown in FIG. 4. FIG. 5 is intended to explain a case where the clock chopper circuit shown in FIG. 4 operates normally, while FIG. 6 is intended to explain a case where the clock chopper circuit shown in FIG. 4 malfunctions.

As shown in FIG. 4, the example of a conventional clock chopper circuit includes inverters I201 to I204, PMOS transistors P201 and P202, and NMOS transistors N201 and N202. Incidentally, reference numeral RST denotes a reset signal containing a low-level enabling pulse.

The inverters I201 to I203 constitute a delay circuit 201 that delays and inverses a wave of a clock signal CLK. The PMOS transistor P201, NMOS transistors N201 and N202, and inverter I204 constitute a difference detection circuit 202 that detects a difference between an output signal S203 of the delay circuit 201 and the clock signal CLK. The difference detection circuit 202 is reset with the reset signal RST.

As shown in FIG. 5, when the clock chopper circuit shown in FIG. 4 receives the clock signal CLK that is not deformed, it operates normally. The clock chopper circuit transmits as an output OUT a pulsating wave PS201 whose starting timing corresponds to the timing of the leading edge of the clock signal CLK and whose terminating timing corresponds to the timing of the trailing edge of the reset signal RST.

In the difference detection circuit 202 included in the clock chopper circuit shown in FIG. 4, the NMOS transistor N201 that receives the output signal S203 of the delay circuit 201 via the gate thereof, and the NMOS transistor N202 that receives the clock signal CLK via the gate thereof are not made of a complementary MOS. Therefore, the output terminal of the difference detection circuit 202 offers a high impedance (floats) during a period from the instant of the leading edge of the clock signal OLK to the instant the reset signal RST gives an instruction. In order to avoid the floating state, for example, a latch circuit may be connected. As the latch circuit has substantially little relation to actions relevant to the present invention, a circuit devoid of a latch circuit is used for explanation.

On the other hand, as shown in FIG. 6, when the clock chopper circuit receives a deformed clock signal CLK, not only a correct pulsating wave PS202 but also an incorrect pulsating wave PS203 are transmitted as an output OUT. This is attributable to a difference between a threshold Vth201 set for the inverter I201 disposed on the first stage in the delay circuit 201 in order receive the clock signal CLK and a threshold Vth202 set for the transistor N202 included in the difference detection circuit 202. The incorrect pulsating wave PS203 is derived from not only a difference in characteristics between transistor types but also a difference of one transistor from the others occurring in the course of manufacture.

As mentioned above, when the example of a conventional clock chopper circuit described with reference to FIGS. 1 to 3 and the example thereof described with reference to FIGS. 4 to 6 receive, for example, a clock signal CLK of a deformed wave (wave exhibiting a large slew rate), they may transmit as an output OUT the pulsating wave PS103 or PS203 that may cause a malfunction.

Consequently, in order to guarantee that the conventional clock chopper circuit operates normally even when receiving, for example, a clock (control) signal CLK exhibiting a very large slew rate, a clock buffer should be inserted as a stage preceding the clock chopper circuit in order to reshape the wave of the clock signal CLK. The insertion of the clock buffer brings about an increase in the number of levels of a clock tree defined in a semiconductor chip to which the clock chopper circuit is adapted and an increase in clock skew. This degrades the fastness in the operation of the semiconductor chip.

Embodiments of a chopper circuit in accordance with the present invention will be described below with reference to appended drawings.

Figure 7:
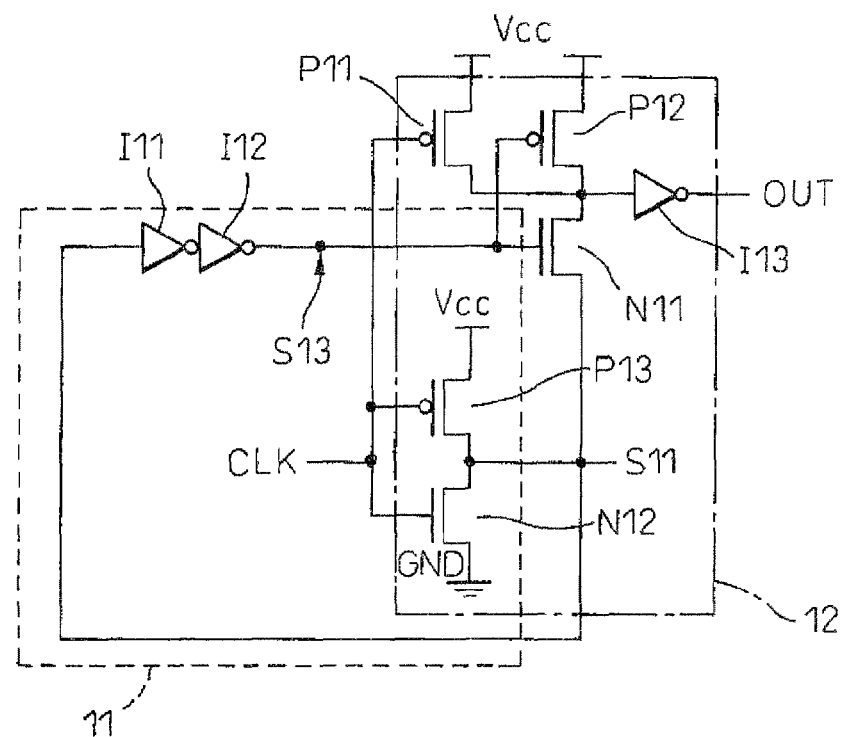
FIG. 7 is a circuit diagram showing the first embodiment of a clock chopper circuit in accordance with the present invention.
Figure 8:
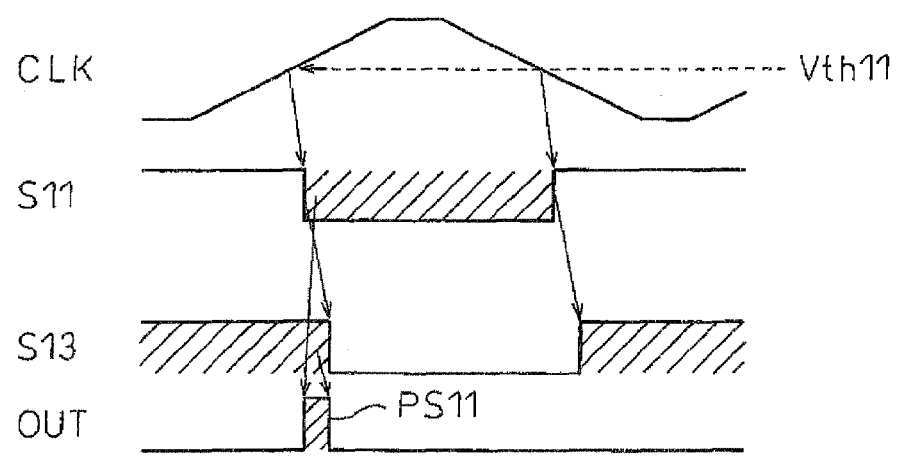
FIG. 8 shows the waveforms of signals to explain the actions to be performed in the clock chopper circuit shown in FIG. 7.

FIG. 7 is a circuit diagram showing the first embodiment of a clock chopper circuit in accordance with the present invention. FIG. 8 shows the waveforms of signals to explain the actions to be performed in the clock chopper circuit shown in FIG. 7.

As shown in FIG. 7, the clock chopper circuit in accordance with the first embodiment includes inverters I11 to I13, PMOS transistors P11, P12, and P13, and NMOS transistors N11 and N12. Incidentally, reference numeral 11 denotes a delay circuit, and reference numeral 12 denotes a difference detection circuit.

The clock chopper circuit in accordance with the first embodiment has the PMOS transistor P13, of which source is connected to a power supply (first power line) Vcc, additionally connected to the drain (S11) of the NMOS transistor N12. Consequently, the PMOS transistor P13 and NMOS transistor N12 constitute an inverter (an inverter on the first state in the delay circuit 11 which receives a clock signal CLK).

The delay circuit 11 includes the inverters I11 and I12 and the transistors P13 and N12 (inverter on the first stage). The difference detection circuit 12 is realized with an AND circuit composed of the PMOS transistors P11 and P12 (P13), NMOS transistors Nil and N12, and inverter I13 (or includes a NAND circuit composed of the transistors P11, P12, N11, and N12 and the inverter I13).

Herein, a CMOS inverter consists of the transistors P13 and N12 (i.e., transistor N12) serves as a common logic circuit that receives a clock signal CLK and that is shared by the delay circuit 11 and difference detection circuit 12. As a first threshold based on which the delay circuit 11 checks a change in a clock signal CLK, and a second threshold based on which the difference detection circuit 12 checks a change in the clock signal CLK, a common threshold (a threshold Vth11 set for the common logic circuit (CMOS inverter composed of the transistors P13 and N12)) is adopted.

Specifically, the NMOS transistor on the first stage in the delay circuit (transistors P13 and N12) which receives the clock signal CLK, and the NMOS transistor (transistor N12) in the difference detection circuit 12 which receives the clock signal CLK are realized with a common transistor, so that actions to be performed in the clock chopper circuit can be controlled with one threshold voltage Vth11 used to check the clock signal CLK.

Consequently, even when the clock chopper circuit of the first embodiment receives a clock signal CLK of a wave deformed as shown in FIG. 8, only a pulsating wave PS11 restricted by one threshold voltage Vth11 that is used to check the clock signal CLK is produced. This prevents a malfunction stemming from erroneous timing (production of an incorrect pulsating wave as an output OUT).

As the delay circuit 11 and difference detection circuit 12 share the same transistor N12 as mentioned above, a new path (extending from the NMOS transistor N11 to the PMOS transistor P13 in FIG. 7) is formed aside from an original common block having two CMOS logic gates. The new path will not adversely affect the action to be performed in the clock chopper circuit. Specifically, when the transistors N11 and P13 are both turned on to become conducting, the transistor N12 is turned off. The circuit elements connected in series with one another from the power supply (first power line) Vcc to the ground GND (second power line) act to turn off. Consequently, the output OUT is driven high. Thus, the new path extending from the transistor N11 to the transistor P13 will not adversely affect the actions of the respective circuit elements.

Figure 9:
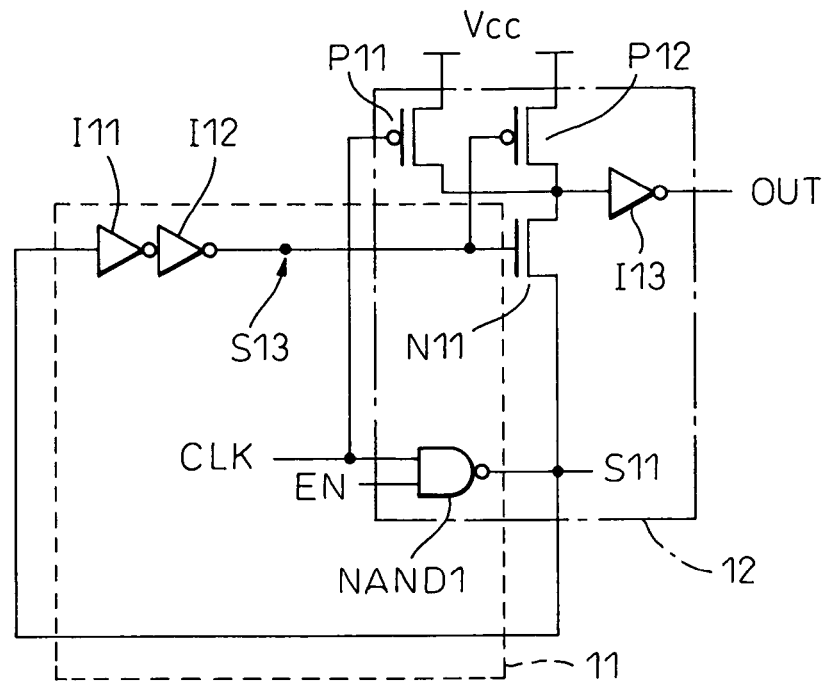
FIG. 9 is a circuit diagram showing a variant of the clock chopper circuit shown in FIG. 7.

FIG. 9 is a circuit diagram showing a variant of the clock chopper circuit shown in FIG. 7.

As shown in FIG. 9, the variant of the first embodiment is identical to the clock chopper circuit shown in FIG. 7 except that a NAND gate NAND1 having two input terminals is substituted for the CMOS inverter composed of the PMOS transistor P13 and NMOS transistor N12. An enabling signal EN is applied to one of the input terminals other than the input terminal to which the clock signal CLK is applied. Consequently, when the enabling signal is driven high, the NAND gate NAND1 acts as an inverter as does the inverter included in the first embodiment. When the enabling signal EN is driven low, a signal S11 is held high. This disables transmission of a pulsating wave PS11 (inactivates the pulsating wave PS11).

Figure 10:
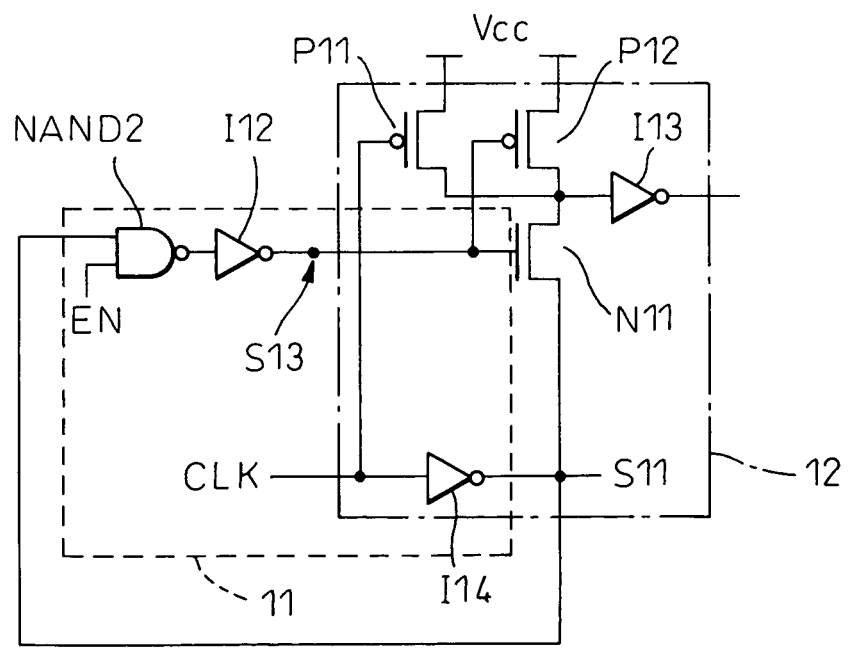
FIG. 10 is a circuit diagram showing another variant of the clock chopper circuit shown in FIG. 7.

FIG. 10 is a circuit diagram showing another variant of the clock chopper circuit shown in FIG. 7.

As shown in FIG. 10, the present variant of the first embodiment is identical to the clock chopper circuit shown in FIG. 7 except that a NAND gate NAND2 having two input terminals is substituted for the inverter I11. An enabling signal EN is applied to one of the input terminals other than the input terminal to which an output signal S11 is applied.

In FIG. 10, reference numeral 114 denotes the inverter composed of the transistors P13 and N12 shown in FIG. 7.

When the enabling signal EN is driven high, the NAND gate NAND2 acts as an inverter like the inverter I11 shown in FIG. 7. When the enabling signal EN is driven low, a signal S13 is held low. This disables transmission of a pulsating wave PS11.

As mentioned above, according to the clock chopper circuit of the first embodiment, as the actions to be performed in the circuit are controlled with one threshold voltage (Vth11) used to check the clock signal CLK. Even if the clock chopper circuit receives the clock signal CLK of a deformed wave, an incorrect pulsating wave dependent on a plurality of thresholds of different levels will not be produced.

Figure 11:
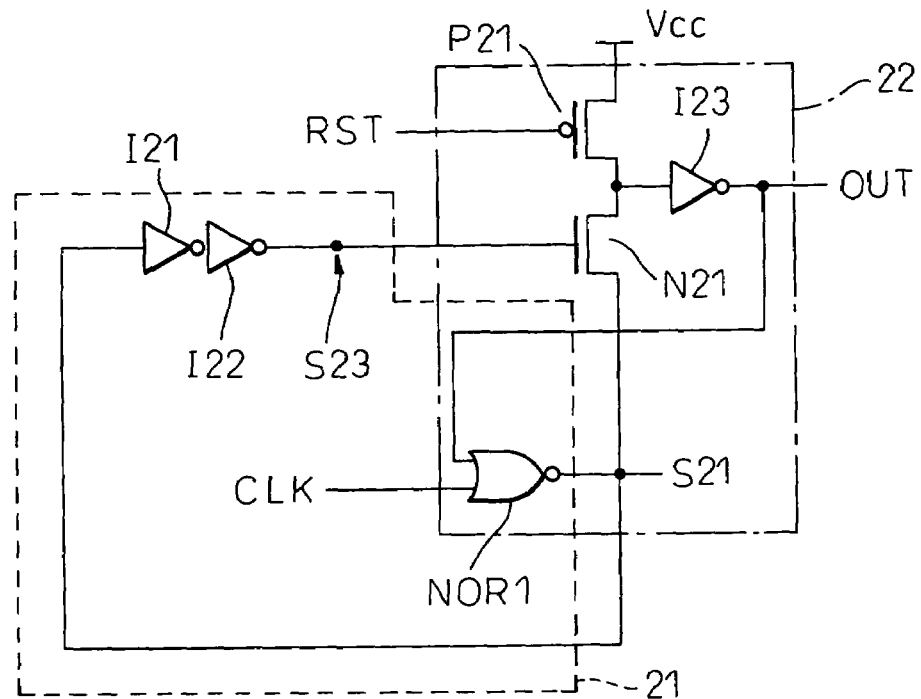
FIG. 11 is a circuit diagram showing the second embodiment of the clock chopper circuit in accordance with the present invention.
Figure 12:
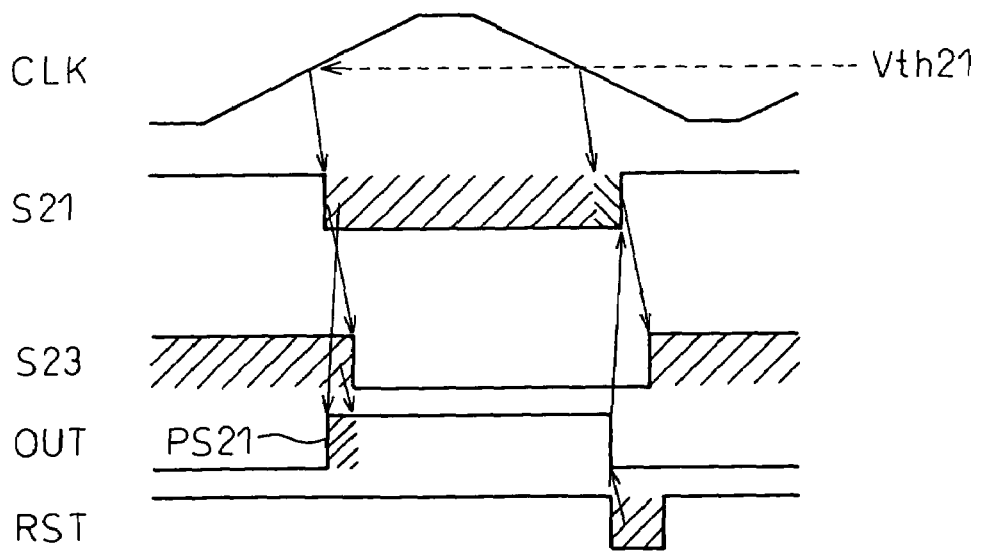
FIG. 12 shows the waveforms of signals to explain the actions to be performed in the clock chopper circuit shown in FIG. 11.

FIG. 11 is a circuit diagram showing the second embodiment of the clock chopper circuit in accordance with the present invention. FIG. 12 shows the waveforms of signals to explain the actions to be performed in the clock chopper circuit shown in FIG. 11.

As shown in FIG. 11, the clock chopper circuit of the second embodiment includes inverters I21 to I23, a PMOS transistor P21, an NMOS transistor N21, and a NOR gate NOR1. Incidentally, reference numeral 21 denotes a delay circuit and reference numeral 22 denotes a difference detection circuit.

In the clock chopper circuit of the second embodiment, the NOR gate NOR1 is substituted for the NMOS transistor N202 included in the conventional clock chopper circuit shown in FIG. 4. The inverter on the first stage in the delay circuit 21 which receives a clock signal CLK and a circuit included in the difference detection circuit 22 are realized with a common circuit, whereby a malfunction stemming from erroneous timing is prevented.

Herein, the inclusion of the NOR gate NOR1 in the difference detection circuit is intended to prevent an output OUT from being reset at the trailing edge of the clock signal CLK. If an inverter is substituted for the NOR gate NOR1, a new path extending from a PMOS transistor included in the inverter to an NMOS transistor (N21) included therein is formed.

Specifically, in the example of the conventional clock chopper circuit shown in FIG. 1, the NAND circuit included in the difference detection circuit (transistors P101, P102, N101, and N102) is made of CMOS. Therefore, when the PMOS transistor P102 included in the inverter is turned on, that is, when the NMOS transistor N10 included therein (that is, NMOS transistor N102 included in the NAND circuit) is turned off, the NAND circuit transmits a high-level signal (an output OUT is driven low). Therefore, although a new path extending from the transistor P102 included in the inverter to the transistor N101 is formed, when the transistor P102 is turned on, no problem occurs.

However, in the example of the conventional clock chopper circuit shown in FIG. 4, the NAND circuit included in the difference detection circuit (transistors P201, N201, and N202) are not made of CMOS. Therefore, even when the NMOS transistor N202 is turned on, the output terminal of the AND circuit offers a high impedance until the reset signal RST comes. The output OUT is therefore not driven.

Consequently, in the difference detection circuit included in the second embodiment shown in FIG. 11 resembling the conventional clock chopper circuit shown in FIG. 4, the output signal (OUT) of an inverter I23 is applied to one of the two input terminals of the NOR gate NOR1 other than the input terminal to which the clock signal CLK is applied. In the meantime, the output OUT is not reset over a new path extending from a PMOS included in the NOR gate NOR1 to a transistor N21. Consequently, only a correct pulsating wave PS21 produced by checking the clock signal CLK on the basis of a threshold Vth21 set for the NOR gate NOR1 is transmitted as the output OUT.

Figure 13:
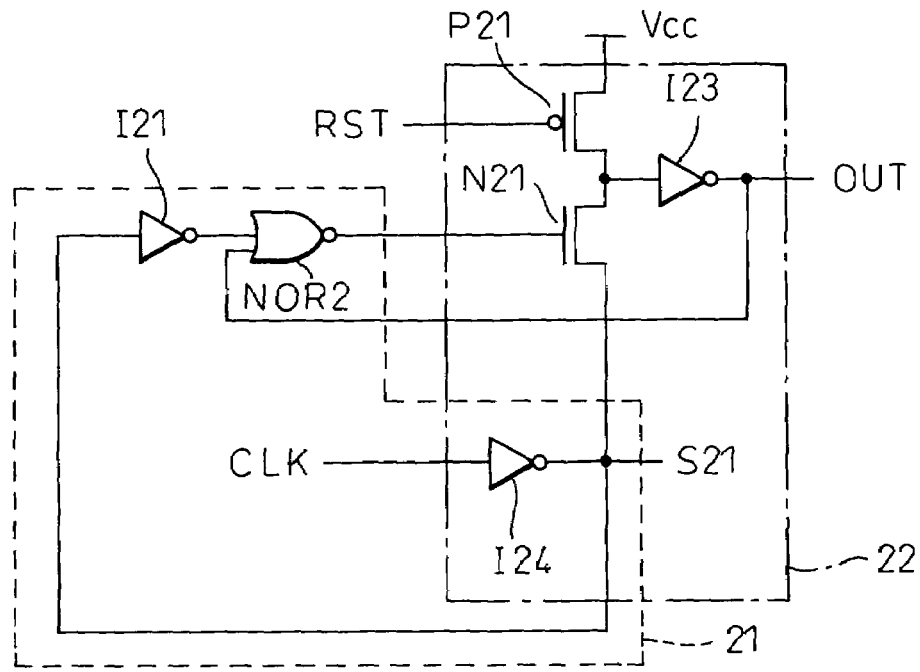
FIG. 13 is a circuit diagram showing a variant of the clock chopper circuit shown in FIG. 11.

FIG. 13 is a circuit diagram showing a variant of the clock chopper circuit shown in FIG. 11.

As shown in FIG. 13, in the variant of the second embodiment, an inverter I24 is substituted for the NOR gate NOR1 included in the clock chopper circuit shown in FIG. 11, and a NOR gate NOR2 having two input terminals is substituted for the inverter I22 included therein. The output signal (OUT) of the inverter I23 is applied to one of the two input terminals other than the input terminal to which the clock signal CLK is applied.

Figure 14:
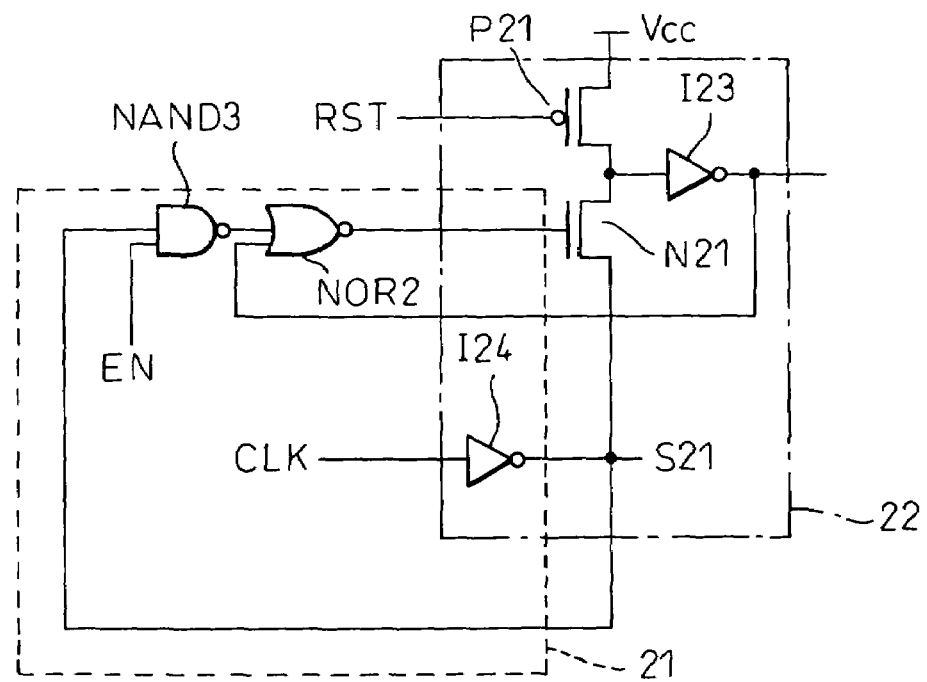
FIG. 14 is a circuit diagram showing another variant of the clock chopper circuit shown in FIG. 11.

FIG. 14 is a circuit diagram showing another variant of the clock chopper circuit shown in FIG. 11.

As shown in FIG. 14, in the present variant of the second embodiment, a NAND gate NAND3 is substituted for the inverter I21 included in the clock chopper circuit shown in FIG. 13. An enabling signal EN is applied to one of the two terminals of the NAND gate NAND3 other than the input terminal to which the output signal (S21) of the inverter I24 is applied.

As mentioned above, according to the clock chopper circuit of the second embodiment, actions to be performed in the circuit are controlled with only one threshold voltage (Vth21) used to check the clock signal CLK. Therefore, even if the clock chopper circuit receives the clock signal CLK of a deformed wave, an incorrect pulsating wave dependent on a plurality of thresholds of different levels will not be produced.

As described so far, in the clock chopper circuit of the present embodiment, part of the difference detection circuit that receives the clock signal CLK and the initial stage in the delay circuit are realized with a common circuit. Consequently, even when the clock signal CLK of a deformed wave is received, a malfunction can be prevented from stemming from the reaction timing provided by the intermediate potential of the clock signal. Moreover, an extra clock buffer need not be inserted in order to reshape a wave, and an increase in a cycle time derived from clock skew can be prevented.

In the above description, the basic configuration of the delay circuit 11 or 12 is an odd number of stages of inverters, and the basic configuration of the difference detection circuit 12 or 22 is an AND (NAND) circuit. The delay circuit and difference detection circuit are not limited to the configurations but may be realized with various kinds of circuits. Needless to say, any signal other than the enabling signal EN can be employed.

The present invention can be applied to a wide variety of circuits including a clock chopper circuit, which chops the edge of a wave of a received clock signal so as to reshape the wave, as a chopper circuit for treating various kinds of received control signals.

Many different embodiments of the present invention may be constructed without departing from the scope of the present invention, and it should be understood that the present invention is not limited to the specific embodiments described in this specification, except as defined in the appended claims.

What is claimed is:

1. A chopper circuit comprising a delay circuit that delays a received control signal and a difference detection circuit that detects a difference between a control signal delayed by said delay circuit and the received control signal, wherein:

said delay circuit comprises an odd number of stages of inversion logic gates connected in series with one another;

a first threshold, based on which said delay circuit checks a change in the received control signal, and a second threshold, based on which said difference detection circuit checks a change in the received control signal, are realized with a threshold to be used by a common logic circuit; and said common logic circuit receives the control signal and is shared by said delay circuit and said difference detection circuit.

2. The chopper circuit as claimed in claim 1, wherein, said difference detection circuit comprises:
   a first transistor of a first conductivity type having a source connected to a first power line and a gate supplied with the control signal;
   a second transistor of the first conductivity type having a source connected to the first power line and a gate supplied with an output signal of said delay circuit;
   a third transistor of a second conductivity type having a drain connected to drains of said first and second transistors respectively and a gate supplied with the output signal of said delay circuit;
   a fourth transistor of the second conductivity type having a source connected to a second power line and a gate supplied with the control signal; and
   a fifth transistor of the first conductivity type connected in common to each of the first power line, a source of said third transistor, and a drain of said fourth transistor, wherein said fourth and fifth transistors constitute said inversion logic gate on a first stage in said delay circuit.

3. The chopper circuit as claimed in claim 2, wherein said inversion logic gate on the first stage is realized with an inverter.

4. The chopper circuit as claimed in claim 2, wherein said inversion logic gate on the first stage is realized with a NAND gate having a first input terminal supplied with the control signal and a second input terminal supplied with an enabling signal.

5. The chopper circuit as claimed in claim 2, wherein said delay circuit comprises an odd number of stages of inverters.

6. The chopper circuit as claimed in claim 3, wherein said delay circuit comprises a NAND gate having a first input terminal supplied with an output signal of said inversion logic gate and a second input terminal supplied with an enabling signal.

7. The chopper circuit as claimed in claim 1, wherein, said difference detection circuit comprises:
   a first transistor of a first conductivity type having a source connected to a first power line and a gate supplied with a reset signal;
   a second transistor of a second conductivity type having a drain connected to a drain of said first transistor and a gate supplied with an output signal of said delay circuit; and
   a NOR gate having a first input terminal supplied with an output of an inverter which is connected to a common drain of said first and second transistors, and a second input terminal supplied with the control signal, wherein said NOR gate realizes said inversion logic gate on the first stage in said delay circuit.

8. The chopper circuit as claimed in claim 1, wherein, said difference detection circuit comprises:
   a first transistor of a first conductivity type having a source connected to a first power line and a gate supplied with a reset signal;
   a second transistor of a second conductivity type having a drain connected to a drain of said first transistor and a gate supplied with an output signal of said delay circuit; and
   an inverter that receives the control signal, said inverter realizing said inversion logic gate on a first stage in said delay circuit, and wherein said difference detection circuit comprises:
   a NOR gate having a first input terminal supplied with an output of said inverter which is connected to a common drain of said first and second transistors, and a second input terminal supplied with an output signal of the first stage of said inversion logic gate via another inversion logic gate.

9. The chopper circuit as claimed in claim 8, wherein said another inversion logic gate comprises a NAND gate having a first input terminal supplied with the output signal of said inversion logic gate, and a second input terminal supplied with an enabling signal.

10. The chopper circuit as claimed in claim 1, wherein the control signal is a clock signal, and said chopper circuit is a clock chopper circuit.

* * * * *